United States Patent [19]
Cholinski

[11] Patent Number: 5,183,508

[45] Date of Patent: Feb. 2, 1993

[54] APPARATUS FOR PATCH COATING PRINTED CIRCUIT BOARDS

[75] Inventor: Edward J. Cholinski, Wayland, Mass.

[73] Assignee: Epicor Technology, Inc., Wayland, Mass.

[21] Appl. No.: 484,518

[22] Filed: Feb. 23, 1990

Related U.S. Application Data

[62] Division of Ser. No. 123,790, Nov. 23, 1987, Pat. No. 4,938,994.

[51] Int. Cl.⁵ .......................... B05C 5/00; B05C 5/02
[52] U.S. Cl. .................................. 118/683; 222/380;
118/DIG. 2; 118/302; 118/410; 118/415
[58] Field of Search ............... 118/401, 302, 407, 410,
118/411, 429, 693, 694, DIG. 2, 203, 415, 683,
684, 679, 50; 427/294; 156/578, 356, 357;
425/149; 222/372, 380; 279/3

[56] References Cited

U.S. PATENT DOCUMENTS

| | | | |
|---|---|---|---|
| 3,420,208 | 1/1969 | Guthrie | 118/683 |
| 3,526,535 | 9/1970 | Plumat | 118/DIG. 2 |
| 3,637,136 | 1/1972 | Bok | 118/302 |
| 3,909,831 | 9/1975 | Marchio et al. | 118/679 |
| 4,030,640 | 6/1977 | Citrin et al. | 222/504 |
| 4,230,793 | 10/1980 | Losert et al. | 427/96 |
| 4,249,478 | 2/1981 | Gruener | 118/683 |
| 4,542,298 | 9/1985 | Holden | 118/50 |
| 4,848,606 | 7/1989 | Taguchi et al. | 118/410 |

Primary Examiner—Michael G. Wityshyn
Assistant Examiner—Charles K. Friedman
Attorney, Agent, or Firm—Richard J. Birch

[57] ABSTRACT

An apparatus for premetered "patch" coating discrete, incremental surfaces or substrates, such as printed circuit boards, integrated circuits and the like, with a preconfigured layer of a liquid in which a controlled volume per unit area of the liquid is applied to the substrate are disclosed. The liquid is dispensed from an applicator slot that is fluidly coupled to a liquid containing chamber. The volume of the liquid in the liquid containing chamber is varied in order to (1) sharply and distinctly start the coating "patch" by producing a pulse of liquid that flows out of the applicator slot to form a connecting bead of liquid coating on the coating surface and (2) sharply and distinctly terminate the coating "patch" by removing the bead of liquid connecting the applicator slot with the coated surface. The width of the coated "patch" is determined by the length of the applicator slot. Relative movement is provided between the applicator slot and the coating surface at least during the period between formation and termination of the bead of liquid in order to produce the desired "patch" length of of liquid coating having predefined boundaries and a predetermined, uniform coating thickness.

22 Claims, 9 Drawing Sheets $$\frac{V \text{ (VOLUMETRIC FLOWRATE)}}{\text{(COATING SPEED) (COATING WIDTH)}} = \underset{\text{THICKNESS}}{T} \times \frac{\text{VOLUME PERCENT SOLIDS}}{100} = \underset{\text{THICKNESS}}{\ell}$$

$$\frac{(1860 \text{ cm}^3/\text{min})}{(610 \text{ cm/min}) \cdot (61 \text{ cm})} = .05 \text{ cm} \times .20 = .01 \text{ cm}$$

$$\frac{(93)}{(610) \cdot (61)} = .0025 \text{ cm} \times .20 = .0005 \text{ cm}$$

APPARATUS FOR PATCH COATING PRINTED CIRCUIT BOARDS

RELATED APPLICATION

The present application is a division of application Ser. No. 123,790 filed Nov. 23, 1987, for Method and Apparatus for Patch Coating Printed Circuit Boards now U.S. Pat. No. 4,938,994 issued Jul. 3, 1990.

BACKGROUND OF THE INVENTION

The present invention relates to liquid coating methods and apparatus in general, and more particularly to a method and apparatus for premetered "patch" coating discrete, incremental surfaces or substrates, such as printed circuit boards, integrated circuits, etc., wherein a premetered volume per unit area of liquid is applied to a surface with a liquid layer "patch" having a pre-configured shape and a predetermined coating thickness.

In the manufacture of printed circuit boards or integrated circuits it is often desirable to apply a liquid coating to the surface of the circuit board or IC wafer, and it is critical that the thickness of that wet coating be uniform across the surface of the board or substrate. In the case of photoresists or photo-imagable solder masks which are solidified either by drying or by crosslinking with radiation, the thickness of the final solidified coating will generally be as uniform as that of the wet coating applied.

In manufacturing printed circuit boards, a photoresist is used to transfer the outline of the circuit into the copper surface of the board. The term "photoresist" defines the dual functioning nature of the material. First it is a photo polymer whose chemical properties are changed by exposure to ultraviolet radiation. That exposure is done selectively through a mask outlining the circuit being defined. The dual functioning comes into play after developing the imaged photo polymer, where the soft unwanted areas are washed off the copper surface. What remains is a protective covering of hardened polymer only in those areas outlined by the exposure mask. In one application, the circuit board is then exposed to an etchant. The protective covering resists the etching process so that only the copper surface left unprotected is etched away. When the developed resist is finally chemically stripped away, the protected copper circuit lines underneath become the electrical conductors of the circuit board.

In the current manufacture of printed circuit boards, the chemical processes of developing the imaged resist, etching the exposed copper, and stripping off the developed resist are all accomplished by exposing the circuit board to a substantial oversupply of the developer, etchant or chemical stripper. This is usually done through a spray process that also provides agitation to enhance removal of the softened or dissolved surface material. These processes are costly, cumbersome and inefficient because by recycling the chemicals for economic reasons, the circuit board's surface is exposed to previously reacted material. This reduces its chemical efficiency in reacting with the surface, increasing cycle time and reducing circuit definition. In addition it is difficult to maintain the quality of the recycled material which causes its rate of reaction with the surface to vary.

It is, accordingly, a general object of the invention to provide an improved coating method and apparatus.

It is a specific object of the invention to provide a method and apparatus for premetered "patch" coating discrete, incremental coating surfaces or substrates in which a controlled volume per unit area of a liquid is applied to the surface or substrate with a liquid layer "patch" having a pre-configured shape and coating thickness.

It is another object of the invention to provide a method and apparatus for premetered "patch" coating discrete, incremental coating surfaces or substrates in which controlled volumes per unit area of liquids are applied together in superposed relation to the surface or substrate with each superposed liquid layer "patch" having a pre-configured shape and coating thickness.

It is a feature of the invention that the coating method can be employed to coat various printed circuit board process liquids on printed circuit boards without requiring a substantial oversupply of each process liquid.

It is another feature of the invention that the apparatus provides for the controlled application of liquids from a sharply defined start to a sharply defined stop of the liquid coating or coatings applied to the substrate surface.

BRIEF DESCRIPTION OF THE INVENTION

The method and corresponding apparatus of the invention provide for the application of a controlled volume per unit area of a liquid coating to a discrete, incremental substrate with a premetered liquid layer "patch" thereon that has a four-sided shape and a predetermined coating thickness. A source of liquid is fluidly coupled to a liquid containing chamber that in turn is fluidly coupled to an applicator slot having an applicator slot exit aperture. With the substrate positioned in proximity to the applicator slot exit aperture, the coating "patch" is initiated by producing a positive pulse of liquid that flows out of the applicator slot exit aperture forming a bead of liquid coating and sending a controlled volumetric flow rate of the liquid through the applicator slot. The positive pulse of liquid preferably is produced by suddenly displacing a volume of the liquid in the liquid containing chamber. Once the liquid connecting bead is formed with the substrate, the controlled volumetric flowrate of the liquid issuing from the applicator slot exit aperture combined with relative movement between the applicator and the substrate apply the liquid coating to the substrate surface. Termination of the liquid coating bead preferably is achieved with a negative, disconnecting pulse that creates a momentary vacuum in a portion of the liquid containing chamber which sucks the coating liquid up into the applicator slot and breaks the connecting bead of liquid coating between the applicator slot exit aperture and the substrate surface.

BRIEF DESCRIPTION OF THE DRAWINGS

The objects and features of the present invention will best be understood from a detailed description of a preferred embodiment thereof, selected for purposes of illustration and shown in the accompanying drawings in which.

DETAILED DESCRIPTION OF THE INVENTION

Figure 1:
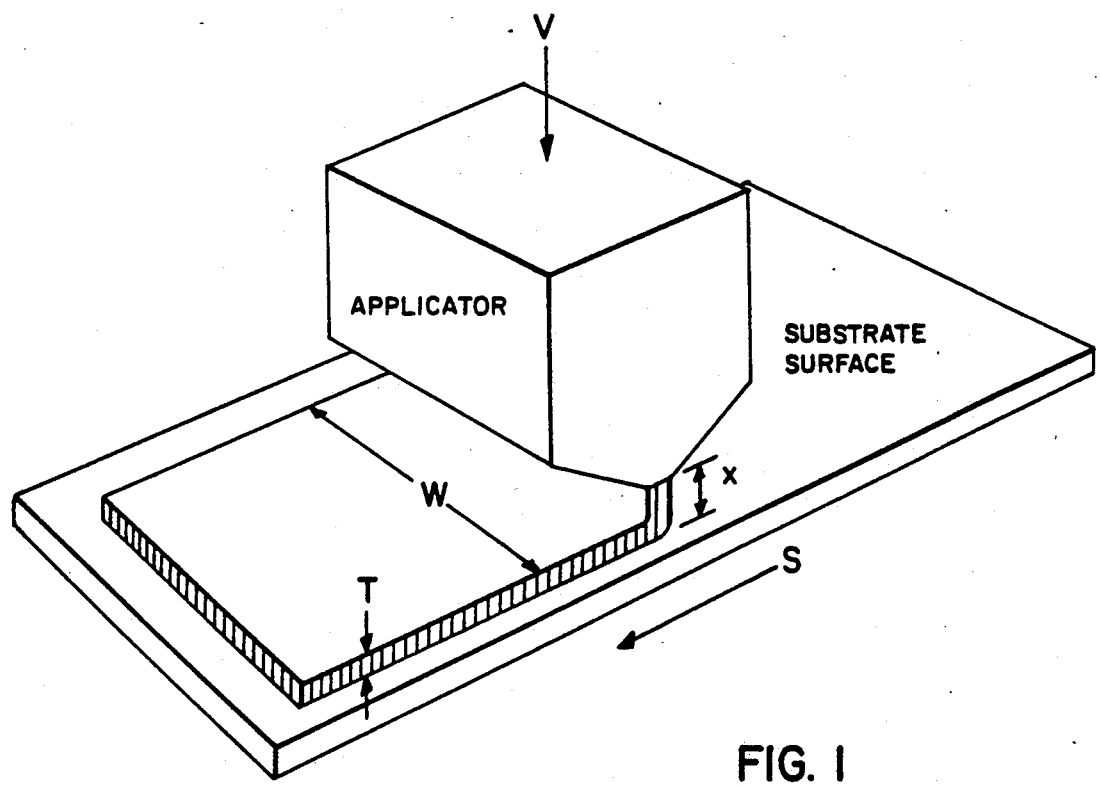
FIG. 1 is a diagrammatic illustration of the liquid coating variables.

Referring now to FIG. 1, there is shown in diagrammatic form a premetered coating process. The process liquid can be coated onto the surface of a printed circuit board be it photoresist, developer, etchant, chemical stripper, solder mask, or any other liquid chemical using a premetered coating system. The term "premetered coating" refers to a process in which a controlled volumetric flowrate of coating liquid is fed into a coating applicator that is spaced a distance x from the surface of a substrate to be coated. As the substrate's surface passes by the applicator, the coating liquid issuing from the applicator slot is deposited onto the surface as a thin uniform layer.

The premetered process differs from a retained process such as dip coating, spin coating, screen coating or roll coating in that these processes expose the substrate's surface to an excess supply of coating liquid. When that excess is removed, the amount retained on the substrate surface is a function of the coating fluid's rheological properties, (viscosity, etc.) and the coating parameters.

Simply stated: in premetered coating a fixed volume is applied, whereas in retained coating excess volume is removed. With the premetered process the liquid's viscosity does not determine the thickness of the wet coating deposited. As shown by the equation in FIG. 1, wet thickness T, is simply a function of the volumetric flowrate V, divided by the coating speed S, and the coating width W. Like all coating processes, if the coating is dried, the dried coating thickness t, is a function of the percent solids of the coating fluid.

With all retained coating processes, the coated wet thickness is a function of the coating liquid's viscosity. Generally, a liquid's viscosity will change if its percent solids changes either by loss of the coating fluid's solvent through evaporation or by over dilution of the coating liquid when solvent is back-added to compensate for evaporation losses. Therefore, in order to maintain the wet thickness in a retained coating process, the percent solids must be precisely monitored and controlled. In addition, since viscosity is thermally dependent, the temperature of the coating liquid must also be precisely controlled.

With the premetered coating process, since there is no excess coating liquid to be removed, the coating liquid can be confined in a closed system until it is applied to the substrate's surface. This prevents any evaporation loss prior to coating. It also maintains the integrity of the coating liquid by minimizing its exposure to external contaminants. With the premetered process, wet thickness can be varied simply by changing the volumetric flowrate, which can be precisely controlled. For example, if a volumetric flowrate of 1860 cm$^3$/min, combined with a coating speed of 610 cm/min and a coating width of 61 cm produces a wet coating thickness of 0.05 centimeters, then simply by reducing the volumetric flowrate to 93 cm$^3$/min, the wet thickness is reduced to 0.0025 cm. (See FIG. 1). If the volume percent solids of the coating liquid were 20%, then the calculated corresponding dry thickness would be 0.01 cm for the 1860 cm$^3$/min volumetric flowrate, and 0.0005 cm for the 93 cm$^3$/min volumetric flowrate. (See FIG. 1).

Figure 2:
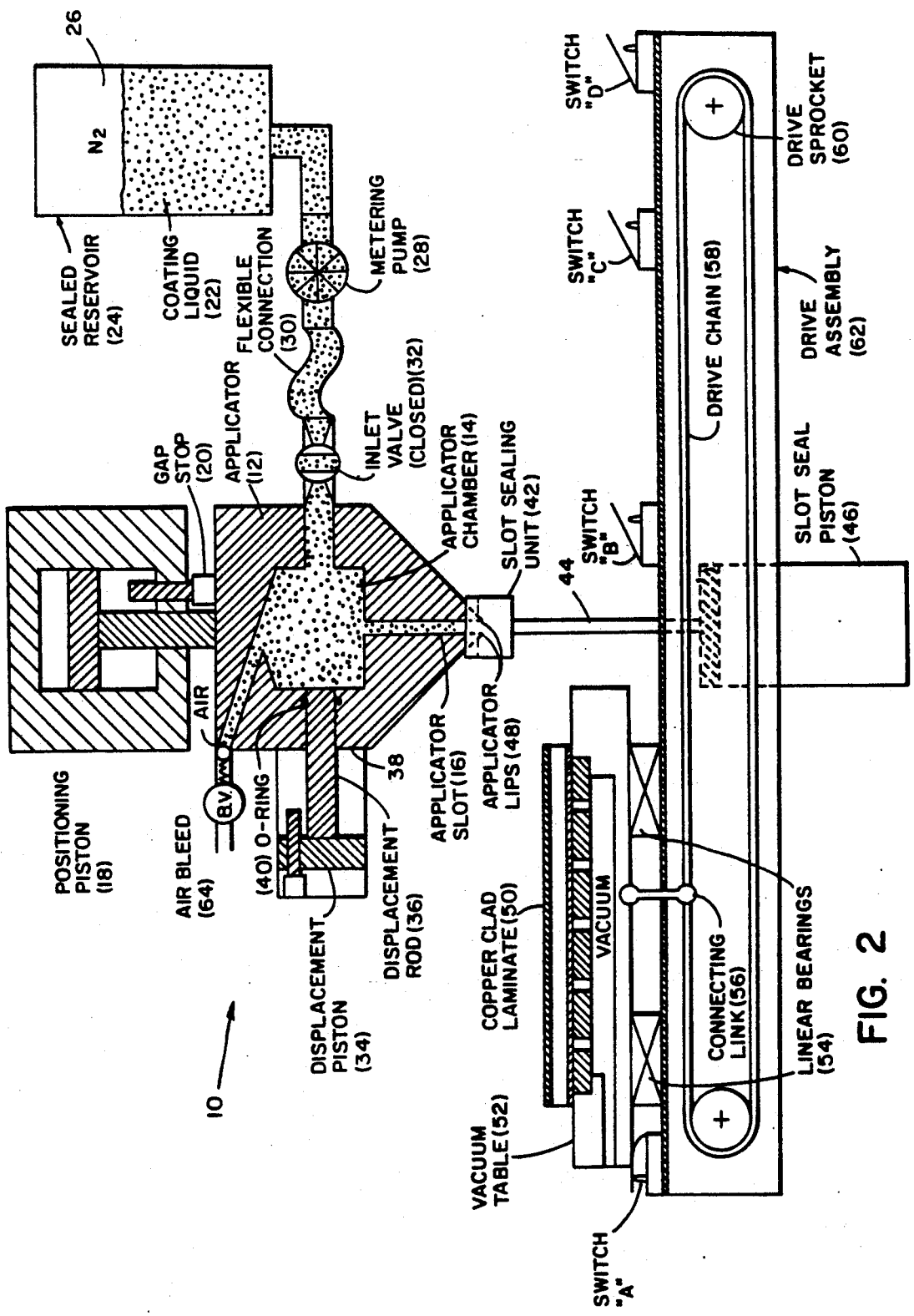
FIG. 2 is a schematic representation of a liquid coating apparatus.

A schematic representation of the premetered "patch" coating process and apparatus is shown in FIGS. 2 through 8. Referring to FIG. 2, there is shown a coating apparatus constructed in accordance with the present invention and indicated generally by the reference numeral 10. The coating apparatus 10 has a coating applicator 12 comprising a chamber 14 and applicator slot 16 supported by a positioning piston 18 having a gap stop adjusting screw 20. The coating liquid 22 which resides in a sealed reservoir 24 under a blanket of nitrogen gas 26 is piped through a metering pump 28 and a flexible connection 30 to an inlet valve 32 mounted on the applicator 12. Also mounted on the applicator is a displacement piston 34 connected to a displacement rod 36 which is inserted through the applicator wall 38 and an O-ring seal 40, accessing the applicator chamber 14. Immediately below the applicator and in contact with the open applicator slot is a slot sealing unit 42 which rides up and down on a shaft 44 connected to the slot seal piston 46. The slot sealing unit 42 cleans the applicator lips 48 prior to and after application of the coating liquid 22 to a copper clad laminate 50 (or substrate surface). At the same time, the slot sealing unit 42 seals the applicator slot exit aperture 51 that is defined by the applicator lips 48.

The copper clad laminate 50 to be coated rests on top of a vacuum table 52 that rides on linear bearings 54 so it can be moved smoothly past the applicator positioned above the table. The vacuum table is fastened with a connecting link 56 to a drive chain 58 which goes around a drive sprocket 60. The drive sprocket 60 can be rotated at a precisely controlled rate by a precision drive motor (not shown). On top of the drive assembly 62 are four micro-switches, A, B, C and D which are used to signal the operating sequence.

In FIG. 2, prior to closing the inlet valve 32, the coating liquid 22 is pumped from the sealed reservoir 24 into the liquid coating applicator chamber 14 and down into the applicator slot 16. Any air coming into the applicator chamber is bled off through an air bleed valve ("B.V.") 64. The slot sealing unit 42 is filled with a solvent similar to that in the coating liquid and the applicator lips 48 are submerged beneath the surface of the solvent in the slot sealing unit. This prevents the coating liquid from drying out in the applicator slot, and washes off any coating liquid left on the applicator lips. Clean lips and slot are desirable because any dried coating on the lips or slot will cause a disruption in the fluid flow resulting in a nonuniformity in the coating.

A vacuum is drawn within the vacuum table and the copper clad laminate which covers the holes in the top of the table is pulled flat by the vacuum, up against the top of the table. The closure of switch "A" has stopped the drive motor from rotating the drive sprocket and has actuated the slot sealing piston to raise the slot sealing unit up into contact with the coating applicator thereby sealing the applicator slot exit aperture 51.

Figure 3:
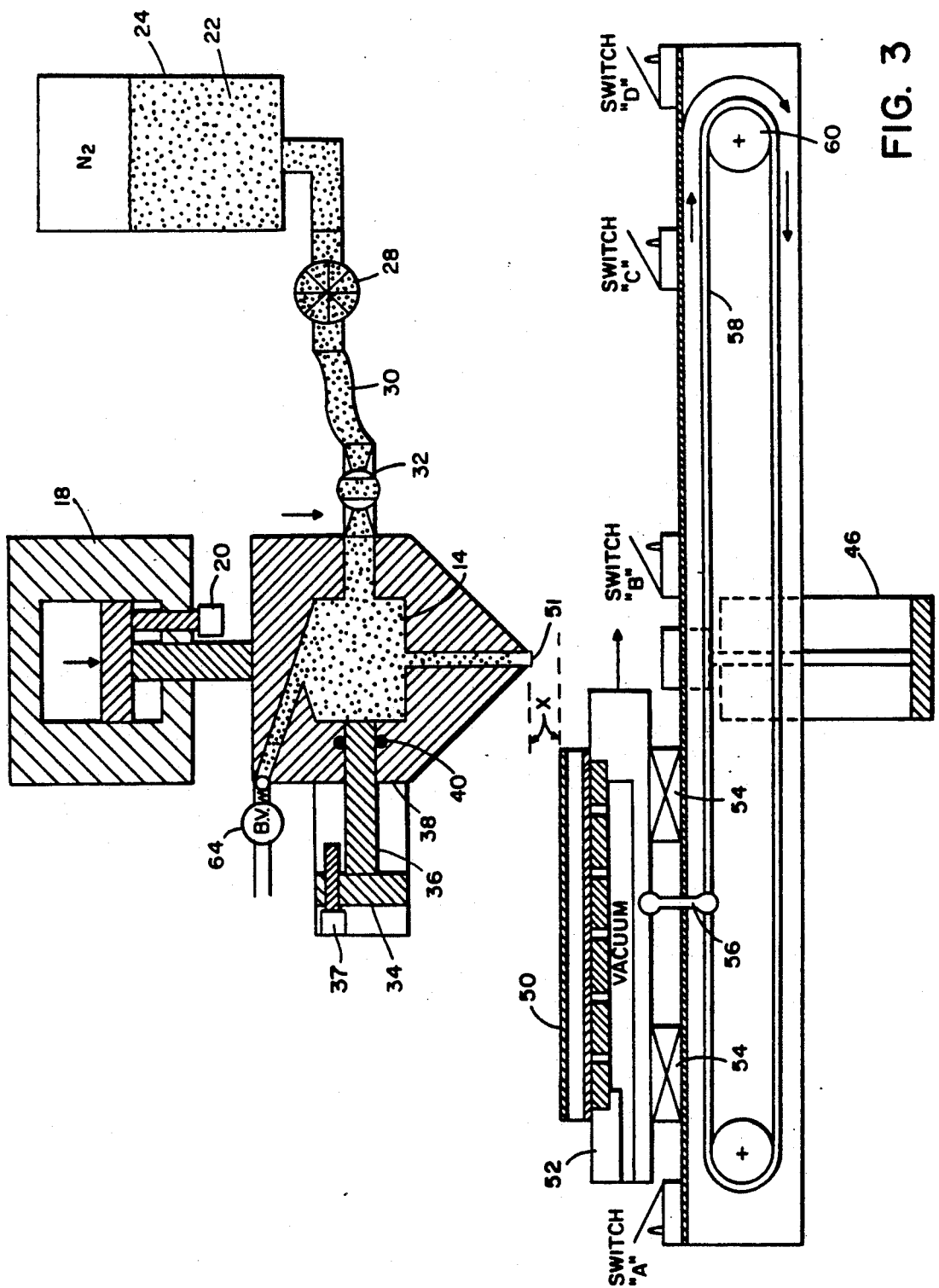
FIG. 3 is another schematic representation of the coating apparatus of FIG. 2 showing the positioned relationship between a printed circuit board and the exit aperture of a coating applicator slot.

When a coating cycle is initiated, an override button (not shown) is pressed which causes the drive motor to start rotating the drive sprocket. This moves the drive chain and through the connecting link drives the vacuum table and the copper clad laminate on top to the right releasing Switch "A" as shown in FIG. 3. The release of Switch "A" causes two actions to occur. First, the slot seal piston 46 retracts the slot sealing unit 42 to a position below the vacuum table. Secondly, the positioning piston 18 strokes downward against the gap stop adjusting screw 20 moving the applicator 12 downward to a predetermined coating gap "x" formed between the applicator slot exit aperture 51 and the surface of the copper clad laminate 50. This coating gap is equal to or less than one centimeter in contrast to certain coating systems where the gap is significantly greater than one centimeter, such as the one shown in U.S. Pat. No. 4,230,793, in which the gap is 10 centimeters.

Figure 4:
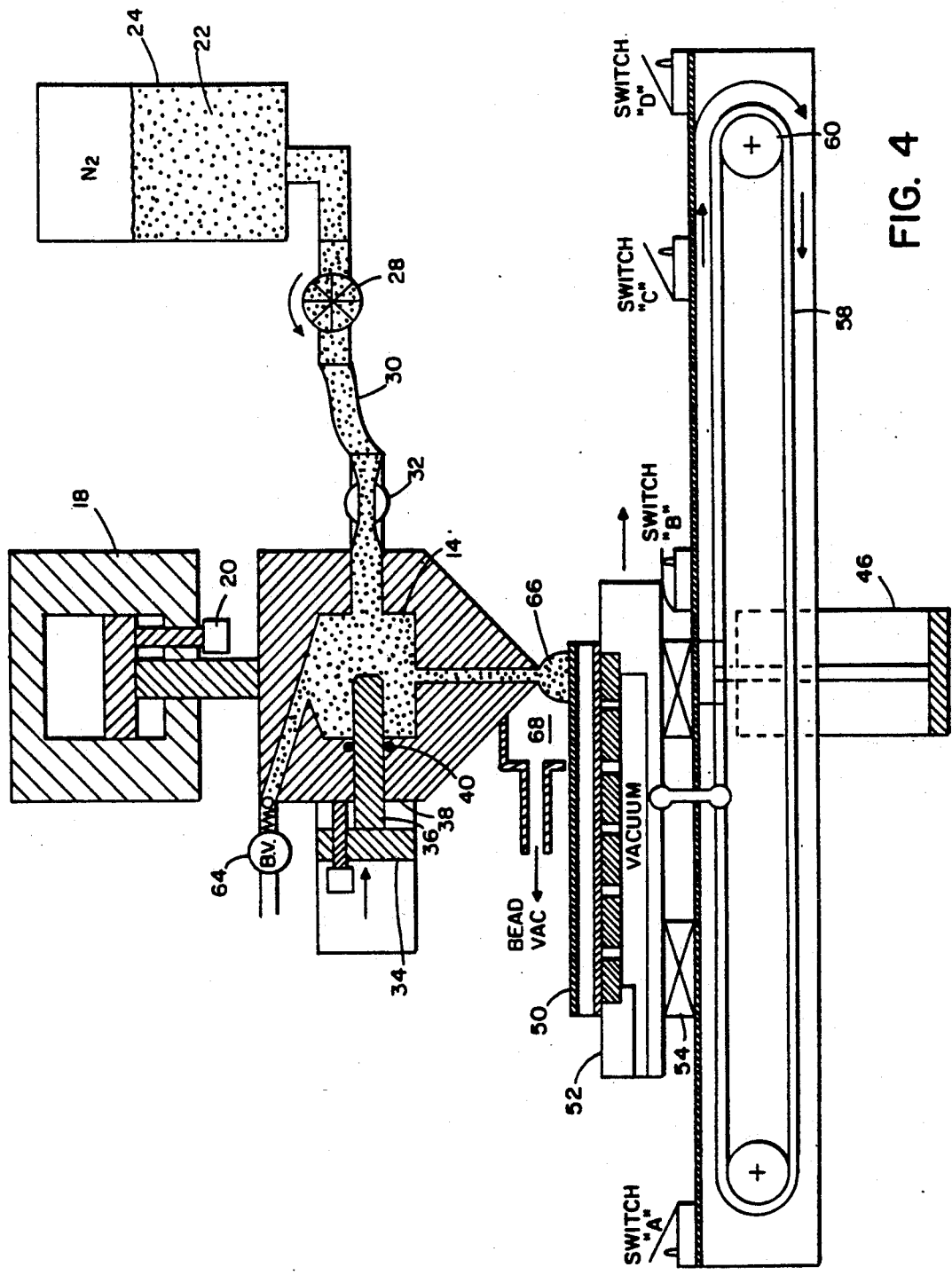
FIG. 4 is another schematic representation of the coating apparatus of FIG. 2 showing the initial application of a bead of the liquid coating on the printed circuit board.

As the vacuum table continues its rightward movement as viewed in FIG. 4, it depresses switch "B" which initiates three operations. In one of these operations, the displacement piston 34 is actuated causing the displacement rod 36 to move rapidly through the O-ring 40 and into the coating liquid containing applicator chamber 14. The length of the displacement rod stroke is controlled by adjustable screw stop 37. The displacement of the liquid caused by the sudden reduction in volume of the liquid in the chamber, produces a positive wave or positive pulse of the coating liquid that surges down the applicator slot, out the applicator slot exit aperture defined by the applicator lips, and onto the surface of the copper clad laminate, forming a connecting bead 66 of coating liquid between the applicator lips and the laminate. As shown in FIG. 4, simultaneously, the inlet valve opens and the metering pump begins to rotate, sending a controlled volumetric flowrate of the coating liquid into and out of the applicator. Preferably, a pressure differential is established across the liquid coating bead 66 by means of a bead vacuum chamber 68 to help keep the coating bead from being pulled away from the applicator lips by the moving surface of the printed circuit board. The bead vacuum chamber 68 is depicted only in FIG. 4 since its use is optional. These actions cause a sharp, uniform start to the coating liquid being deposited on the printed circuit board.

If a relatively large positive pulse is employed, the piston can be retracted (as described below in connection with FIG. 6) immediately to suck-up the excess liquid without breaking the coating bead. This oscillatory action of the piston generates first a positive and then a negative pulse. The use of the oscillatory pulse sequence of positive then negative, permits a larger pulse amplitude (volumetric displacement of the coating liquid) which insures proper connection of coating liquid bead with printed circuit board, especially when the coating speed and/or coating gap are increased and/or when the wet thickness of liquid is decreased.

The oscillatory pulses can be generated by single or multiple displacement piston assemblies, such as, one or more pistons 34 and displacement rods 36. Furthermore, the location of the displacement piston(s) can be varied from that shown in the Figures. Given the liquid dynamics, it can be seen that the piston(s) and its volumetric displacement chamber can be positioned upstream from the applicator 12 and, preferably, downstream from the inlet valve 32 while still producing the desired positive and negative pulses.

If the sequence of the oscillatory pulsing of one of the displacement piston assemblies is reversed from (positive pulse first, then negative pulse) to (negative pulse first, then positive pulse), then instead of producing a connecting bead, the bead is disconnected by first sucking the liquid up into the applicator slot then expelling it out toward the applicator slot exit aperture, but not sufficiently to reconnect the bead to the printed circuit board. In this way, the applicator slot is kept filled with liquid thereby eliminating air bubbles that could rise up the applicator slot and into the applicator chamber once the liquid flow through the applicator slot has been terminated.

Regulation of the volumetric displacement, the individual pulse duration and pulse amplitude and the time interval between positive and negative pulses allows a wide range of control for formation and removal of the connecting bead of liquid coating.

Figure 5:
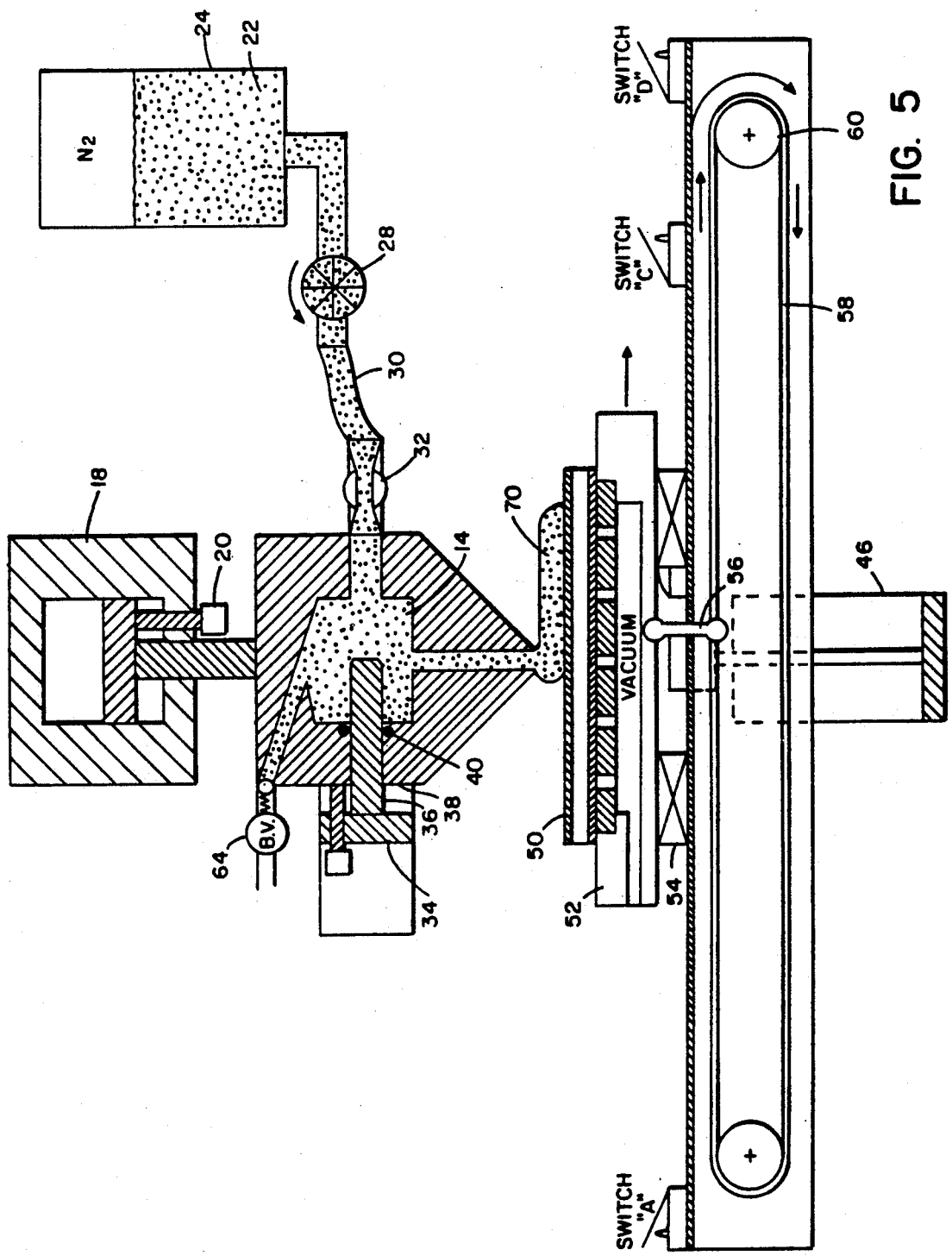
FIG. 5 is another schematic representation of the coating apparatus of FIG. 2 showing further application of the liquid coating to the printed circuit board.

Continuing with the sequence of operation shown in the drawings, as the vacuum table and the laminate move to the right, a dynamic wetting action occurs whereby the liquid coming out of the applicator slot exit aperture is continuously applied to the surface of the laminate as a uniformly thick layer 70 as shown in FIG. 5. The thickness of this layer is determined by the equation previously described and presented in FIG. 1.

Figure 6:
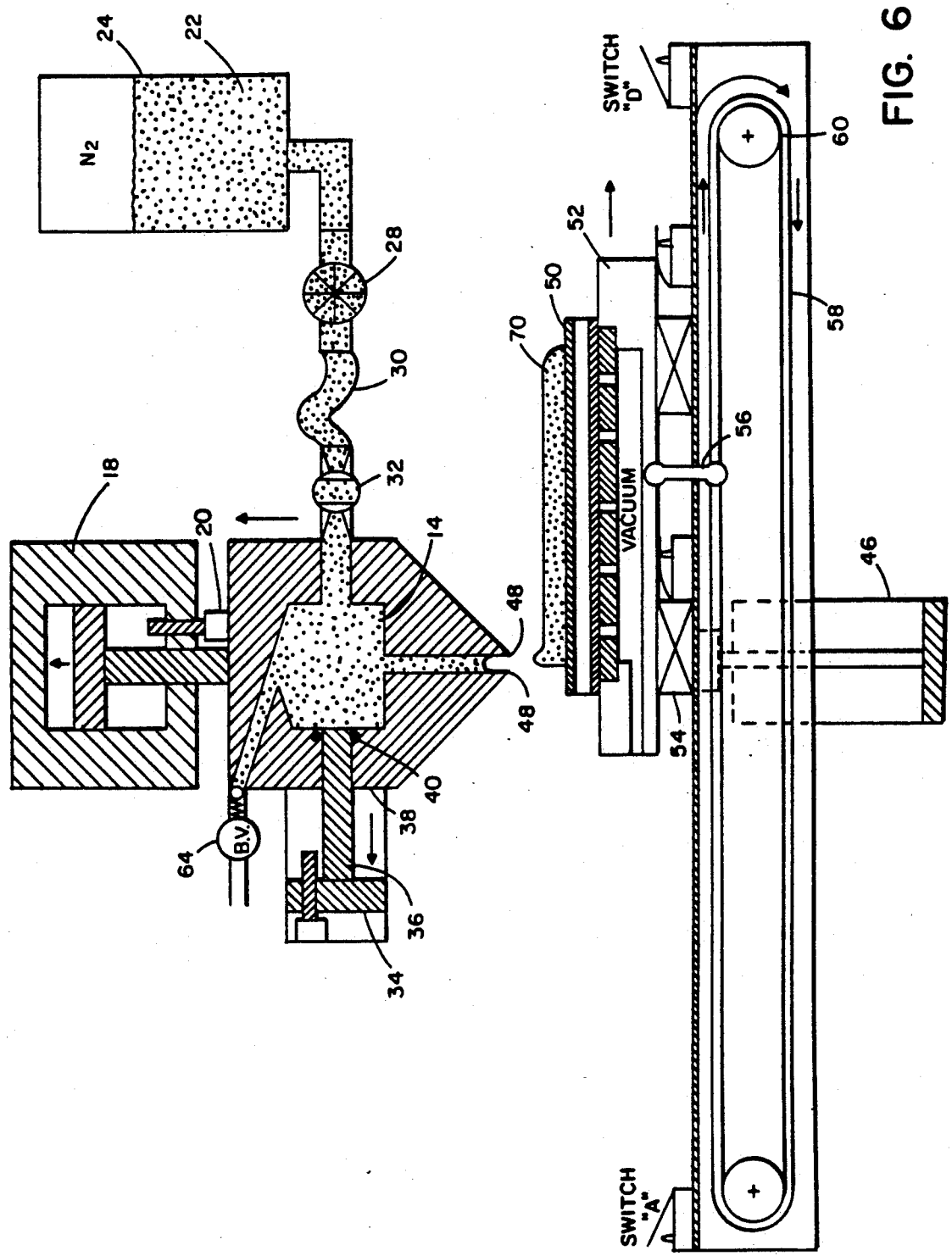
FIG. 6 is another schematic representation of the coating apparatus of FIG. 2 showing termination of the application of the liquid coating to the printed circuit board.
Figure 7:
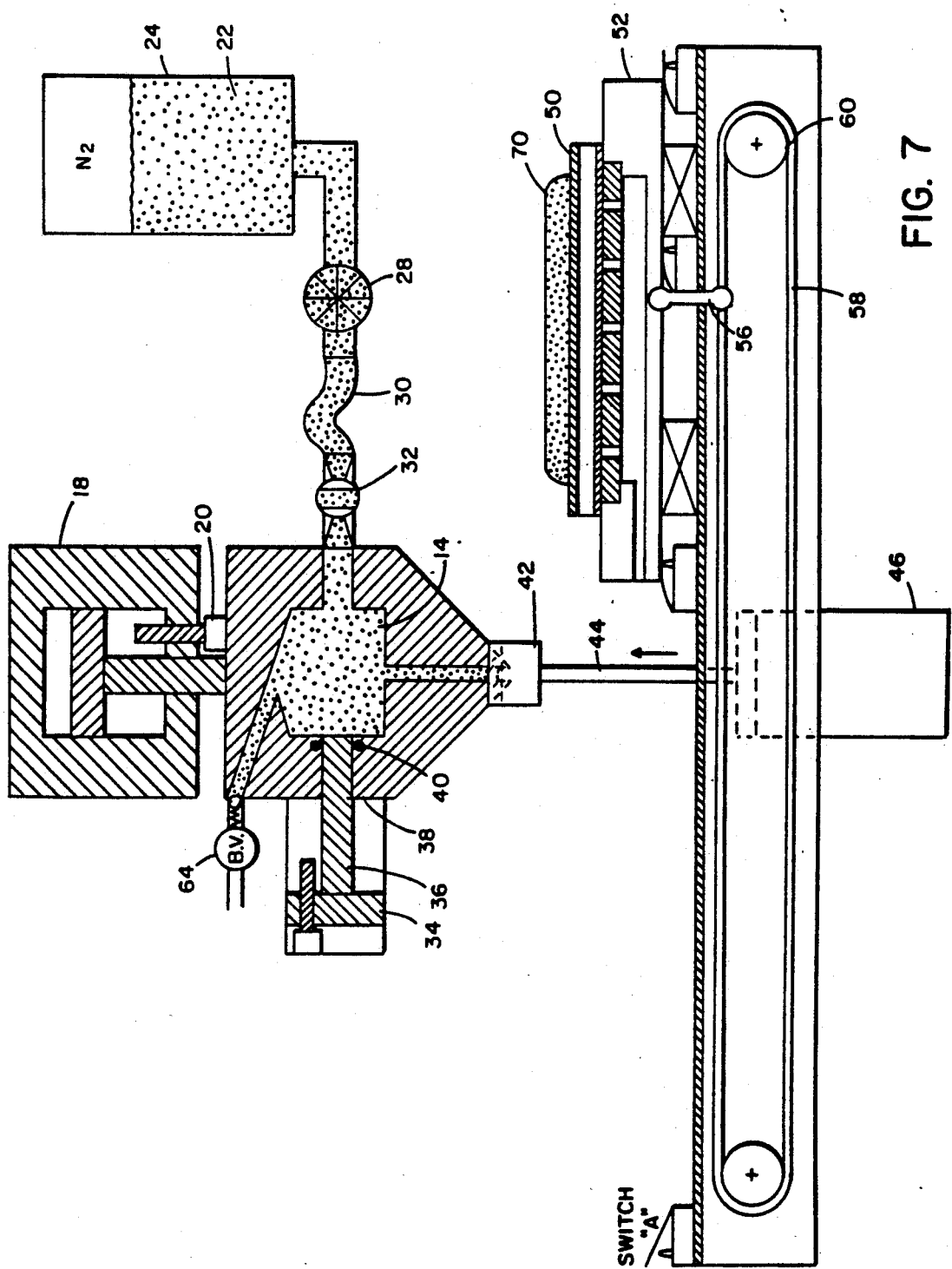
FIG. 7 is another schematic representation of the coating apparatus of FIG. 2 showing the sealing of the applicator slot.
Figure 8:
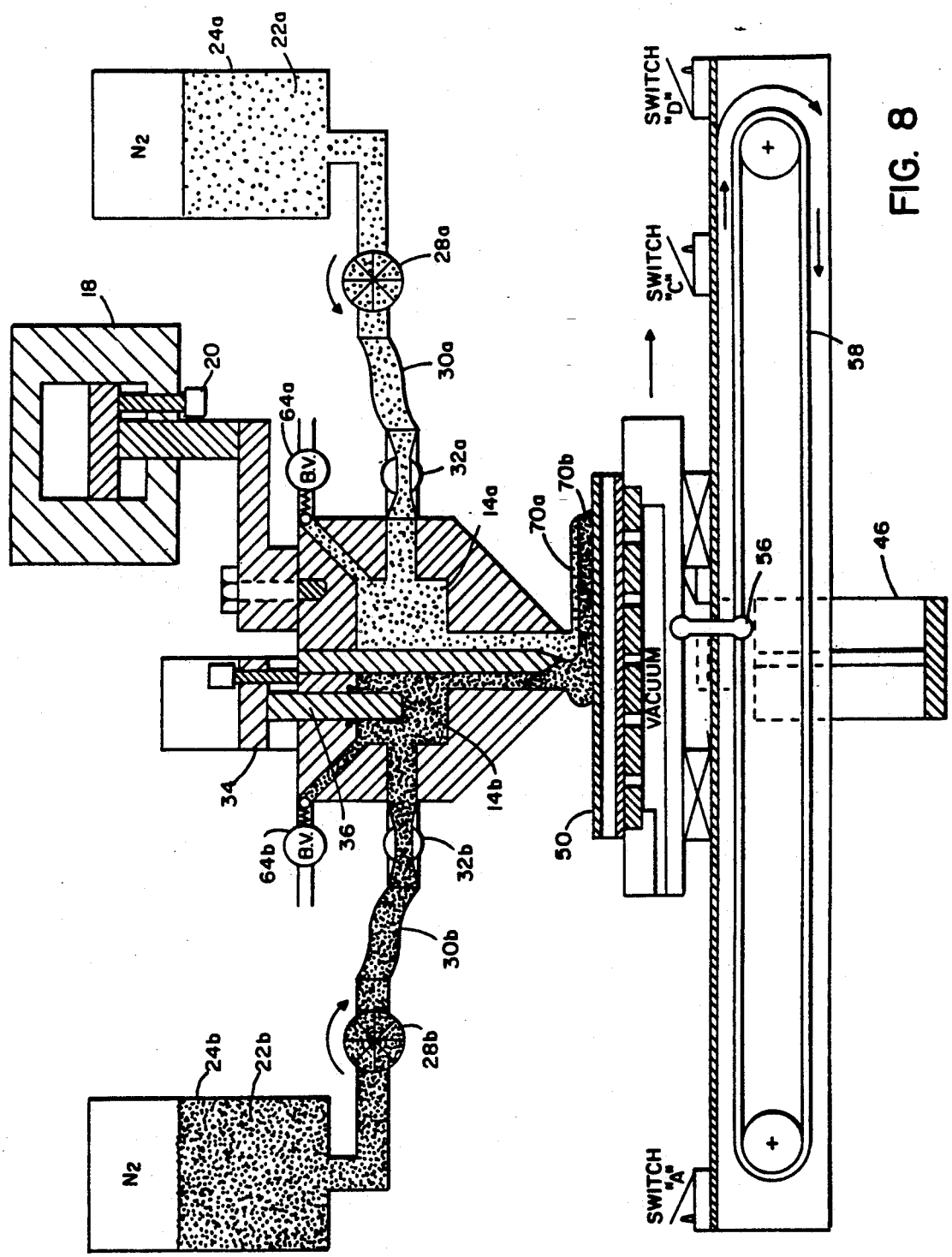
FIG. 8 is a schematic representation of a multilayer coating apparatus for the simultaneous application of two liquid layers to a substrate; and, FIG. 9 is a schematic representation of a process for manufacturing a printed circuit board.

The application of the coating continues until the vacuum table depresses switch "C". Upon closure of switch "C", the inlet valve 32 closes, the metering pump 28 stops and the displacement piston 34 rapidly retracts the displacement rod 36 back out of the applicator chamber. A negative pulse is produced by retraction of the displacement rod which creates a momentary vacuum in the applicator chamber causing the coating liquid to surge upward into the applicator slot as shown in FIG. 6. Simultaneously the positioning piston pulls the applicator back up against the gap stop as illustrated by the movement arrows in FIG. 6. These actions cause an abrupt break to the connecting bead of the liquid coating leaving a clean, sharp end to the deposited liquid coating layer on the printed circuit board (or the substrate surface). Finally, in FIG. 7 when the vacuum table depresses switch "D", the drive motor stops rotating and the slot seal piston 46 raises the slot sealing unit 42 up into contact with the coating applicator lips 48. The vacuum on the vacuum table 52 is released and the coated circuit board 50 can now be removed for further processing.

It may be desirable at times to coat more than one layer in superposed relationship on the substrate, e.g., a printed circuit board or integrated circuit where each layer may be chemically different and may provide a different function. In order to eliminate the need to coat and dry each layer separately, the liquid layers can be applied to the substrate simultaneously using a multilayer premetered "patch" coating applicator shown schematically in FIG. 8. The same reference numerals are used in FIG. 8 as were used in the previous Figures except that letters "a" and "b" are employed to indicate the two separate coating liquid systems. By carefully formulating the coating liquids, the layers when applied remain essentially separate and distinct. This "one pass" approach can offer substantial economic benefits in yield, productivity and capital expenditure.

It will be appreciated that the connecting bead of liquid coating can be formed by positive pulsing prior to the arrival of the printed circuit board 50 beneath the applicator lips 51 as viewed in FIG. 3. In this case, the bead is first connected to the vacuum table 52 and then to the printed circuit board. Similarly, the connecting bead can be terminated either by negative pulsing and/or sufficiently increasing the gap distance x after the printed circuit board has passed the applicator lips. If at any time between formation and termination of the connecting bead of liquid coating, the bead becomes discontinuous or disrupted, these problems can be corrected by means of a stabilizing pulse of liquid either positive or oscillatory (postive, then negative), preferably oscillatory). The effect of the stabilizing pulse can be aided by momentarily closing the inlet valve 32 during the duration of the pulse or by using a check valve (not shown) located upstream from the liquid coating chamber.

Although the printed circuit board 50 has been shown in the figures as a single printed circuit board for purposes of illustration, it should be understood that plural printed circuit boards can be positioned on the vacuum table 52, preferably in abutting relation, to permit the coating of plural printed circuit boards in a "single pass". Alternatively, more than one vacuum table can be employed to transport corresponding printed circuit boards. The separation distance between vacuum tables, and therefore the printed circuit boards, should be minimized to prevent coating discontinuities. However, any such coating discontinuities can be corrected by means of a stabilizing pulse.

Figure 9:
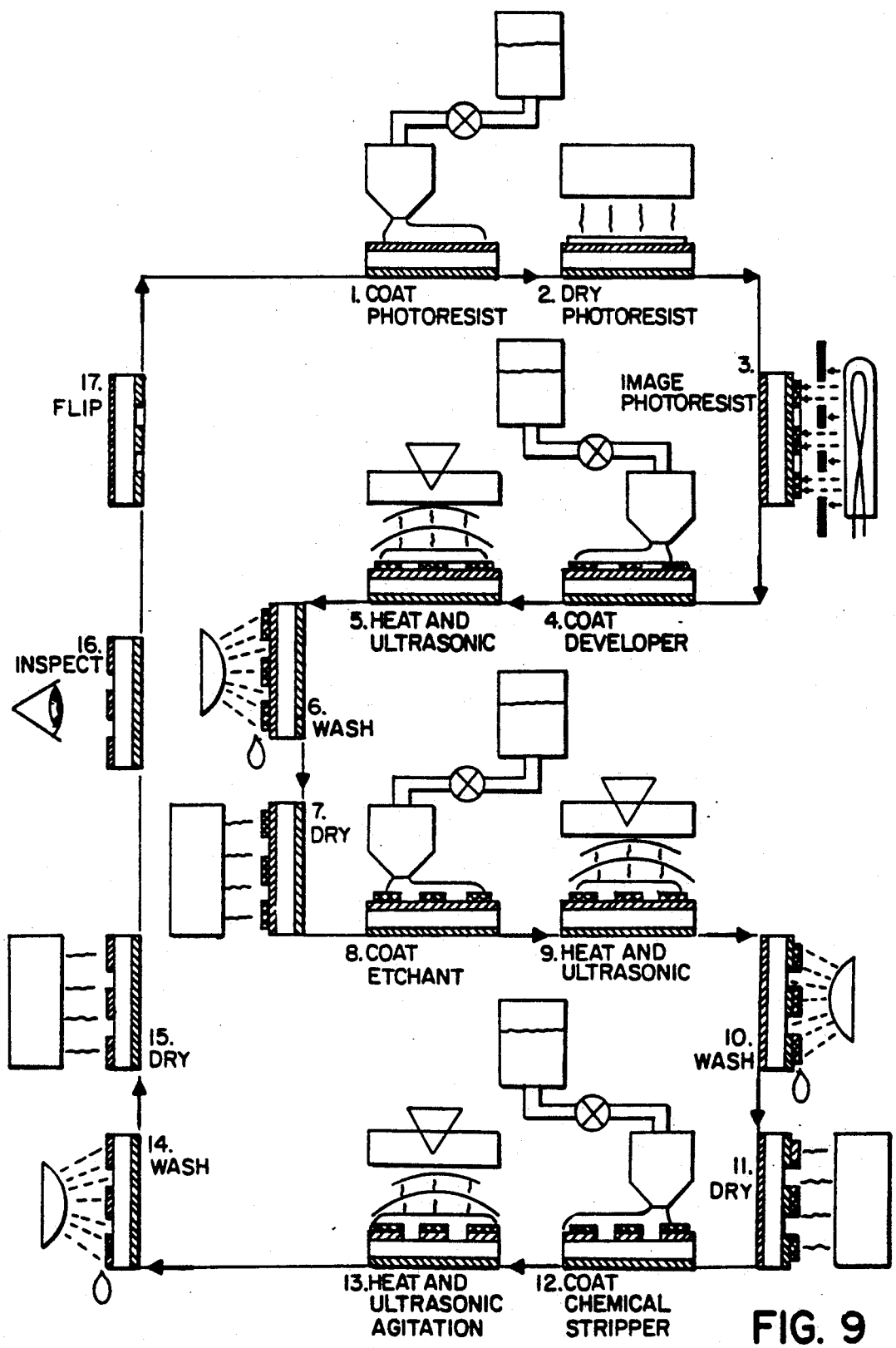

Referring to FIG. 9, Steps 1-17 present a pictoral schematic process flow diagram illustrating how the premetered "patch" coating process can be used in the manufacturing of a printed circuit board from start to finish. In Step 1 a liquid photoresist is coated onto the surface of a copper clad laminate using the premetered "patch" coating process and apparatus described in FIGS. 2-8. In Step 2, the coated laminate moves into a dryer where the coating is solidified by driving off the solvent using heated air. After drying the laminate moves to an imaging station Step 3, where the photoresist is selectively exposed through a mask. In Step 4, the imaged photoresist is coated with a developer liquid. In Step 5, using heat in combination with ultrasonic sound waves to agitate the liquid coating, the unexposed resist is softened by the developer and loosened from the surface of the copper clad laminate. The circuit board then moves to a wash station in Step 6 where the loose and softened unexposed photoresist is washed off. In Step 7, the laminate is then dried before it goes to the next station.

In Step 8, an etching solution is coated onto the laminate. In Step 9 again in combination with heat and ultrasonic sound, the etchant dissolves the copper surface off the laminate only where it is not protected by the developed photoresist. The circuit board then moves to Step 10 where the dissolved copper and spent etchant are washed off, and in Step 11 the laminate is again dried thoroughly. In Step 12 a chemical stripper is coated onto the laminate over the developed photoresist. In Step 13 using heat and ultrasonic sound, the chemical stripper softens and loosens the developed photoresist from the copper surface below. The circuit board then moves to Step 14 where the soft and loosened photoresist is washed away and in Step 15 the laminate is again dried. The circuit board then moves to an inspection station in Step 16 where it is analyzed for dimensional accuracy and electrical continuity. Once it passes the inspection it goes to a final operation where the circuit board is flipped over to expose the other surface of the copper clad laminate in Step 17. The laminate then begins to go through Steps 1-16 of the cycle again to generate the circuitry on the other side of the board. After passing inspection at Step 16 the second time, the completed double sided circuit board is removed for further processing.

By operating the circuit manufacturing process as a continuous line as shown in Steps 1-17, with the premetered "patch" coating process employed in Steps 1, 4, 8 and 12, a tremendous increase in productivity is obtained over the current method of batch manufacturing. In addition costs are substantially reduced due to less operating personnel and the yield is increased due to reduced manual handling of the circuit boards. The premetered "patch" coating process also reduces the quantity of chemicals required because of their controlled and efficient application. In summary, the premetered "patch" coating process for manufacturing printed circuit boards offers a more cost effective, efficient and productive manufacturing process than those currently available.

Having described in detail a preferred embodiment of my invention, it will now be apparent to those skilled in the art that numerous modifications can be made therein without departing from the scope of the invention as defined in the following claims. For example, although the positive and negative liquid pulses have been shown as being produced by a displacement system, these pulses also can be produced by momentarily increasing or decreasing any existing volumetric flowrate of the liquid so that the net result of liquid flow is either out of or into the applicator slot exit aperture. This can be accomplished by controlling the speed and rotational direction of the metering pump 28.

What I claim is:

1. A bead coating apparatus for applying a layer of liquid with a controlled volume per unit area of the liquid to a substrate, said apparatus comprising:
   A. a source of a liquid;
   B. a liquid containing chamber;
   C. an applicator slot in liquid communication with said liquid containing chamber, said applicator slot having a set of applicator lips that define an applicator slot exit aperture;
   D. means for fluidly coupling said source of a liquid to said liquid containing chamber;
   E. means for moving a substrate and the applicator slot exit aperture into proximity with each other;
   F. means for sending a controlled volumetric flowrate of liquid from the source of the liquid to the liquid containing chamber and through the applicator slot and then out of the applicator slot exit aperture to create a uniform volumetric flowrate of liquid exiting from each point along the applicator slot exit aperture;
   G. means for generating a pulse to control the formation of a connecting bead of liquid coating on the substrate; and, H. means for relatively moving the substrate and the applicator slot exit aperture with respect to each other to apply a controlled volume per unit area of the liquid to the substrate.

2. The bead coating apparatus of claim 1 further comprising means for terminating the flow of liquid from said applicator slot exit aperture.

3. The bead coating apparatus of claim 1 wherein said means for moving the substrate and the applicator slot exit aperture into proximity with each other includes means for moving said substrate and said applicator slot exit aperture out of proximity with each other.

4. The bead coating apparatus of claim 1 further comprising means for sealing and unsealing said applicator slot exit aperture.

5. The bead coating apparatus of claim 1 further comprising means for cleaning said set of applicator lips.

6. The bead coating apparatus of claim 1 wherein said means for moving a substrate and the applicator slot exit aperture into proximity with each other includes vacuum means for holding the substrate.

7. The bead coating apparatus of claim 1 wherein said means for generating a pulse includes means for generating a negative pulse of liquid that flows into the applicator slot exit aperture to control the formation of the connecting bead of liquid coating on the substrate.

8. The bead coating apparatus of claim 7 wherein said negative pulse generating means includes means for selectively varying the volume of liquid in said liquid containing chamber.

9. The bead coating apparatus of claim 7 wherein said negative pulse generating means includes a variable speed metering pump means for controlling the flowrate of said liquid through the applicator slot exit aperture.

10. The bead coating apparatus of claim 1 further comprising means for generating positive and negative pulses of liquid to control the formation of the conecting bead of liquid coating on the substrate.

11. The bead coating apparatus of claim 10 wherein said positive and negative pulse generating means includes a variable speed reversible metering pump means for controlling the direction and flowrate of said liquid through the applicator slot exit aperture.

12. The bead coating apparatus of claim 10 further comprising means for controlling the duration, amplitude and timing of said positive and negative pulses.

13. The bead coating apparatus of claim 10 wherein said positive and negative pulse generating means includes means for selectively varying the volume of liquid in said liquid containing chamber.

14. The bead coating apparatus of claim 1 further comprising means for establishing a differential pressure across the connecting bead of liquid coating.

15. The bead coating apparatus of claim 14 wherein the lower pressure is on the downstream side of the connecting bead of liquid coating towards the uncoated portion of the substrate after relative movement of the substrate and the applicator slot exit aperture.

16. The bead coating apparatus of claim 1 wherein said means for generating a pulse includes means for generating a positive pulse of liquid that flows out of the applicator slot exit aperture to control the formation of the connecting bead of liquid coating on the substrate.

17. The bead coating apparatus of claim 16 wherein said positive pulse generating means includes means for selectively varying the volume of liquid in said liquid containing chamber.

18. The bead coating apparatus of claim 16 wherein said positive pulse generating means includes a variable speed metering pump means for controlling the flowrate of said liquid through the applicator slot exit aperture.

19. The bead coating apparatus of claim 1 further comprising means for controlling the amplitude of said pulse.

20. The bead coating apparatus of claim 1 further comprising means for controlling the timing of said pulse.

21. The bead coating apparatus of claim 1 wherein said means for moving a substrate and the applicator slot exit aperture into proximity with each other includes means for selectively varying over time the degree of proximity.

22. The bead coating apparatus of claim 1 further comprising means for controlling the duration of said pulse.

* * * * *

UNITED STATES PATENT AND TRADEMARK OFFICE
CERTIFICATE OF CORRECTION

PATENT NO. : 5,183,508

DATED : February 2, 1993

INVENTOR(S) : Edward J. Choinski

It is certified that error appears in the above-identified patent and that said Letters Patent is hereby corrected as shown below:

On the title page, Item [75] "Cholinski" should be --Choinski--.

Signed and Sealed this

Thirtieth Day of March, 1993

*Attest:*

STEPHEN G. KUNIN

*Attesting Officer*      *Acting Commissioner of Patents and Trademarks*